United States Patent [19]

Opower et al.

[11] Patent Number: 5,513,195
[45] Date of Patent: Apr. 30, 1996

[54] PHASE-CONTROLLED, FRACTAL LASER SYSTEM

[75] Inventors: Hans Opower, Krailling; Helmut Huegel, Sindelfingen; Adolf Giesen, Stuttgart, all of Germany

[73] Assignees: Deutsche Forschungsanstalt fuer Luft-und Raumfahrt e.V., Bonn; Universitaet Stuttgart Institut fuer Strahlwerkzeuge, Stuttgart, both of Germany

[21] Appl. No.: 307,712

[22] PCT Filed: Jan. 14, 1994

[86] PCT No.: PCT/DE94/00036

§ 371 Date: Sep. 21, 1994

§ 102(e) Date: Sep. 21, 1994

[87] PCT Pub. No.: WO94/17575

PCT Pub. Date: Aug. 4, 1994

[30] Foreign Application Priority Data

Jan. 22, 1993 [DE] Germany .................. 43 01 687.1

[51] Int. Cl.[6] .................................................. H01S 3/098
[52] U.S. Cl. .................. 372/18; 372/19; 372/31; 372/32
[58] Field of Search ............................ 372/69–72, 92, 372/19, 75, 6

[56] References Cited

U.S. PATENT DOCUMENTS

| | | |
|---|---|---|
| 3,590,248 | 6/1971 | Chatterton . |
| 4,901,329 | 2/1990 | Leas . |
| 5,003,550 | 3/1991 | Welch et al. . |
| 5,202,893 | 4/1993 | Kubota et al. ................. 372/34 |
| 5,379,315 | 1/1995 | Meinzer ........................ 372/101 |

FOREIGN PATENT DOCUMENTS 2153969  5/1973  Germany .

OTHER PUBLICATIONS

J. Berger, et al., "Fiber–Bundle Coupled, Diode End–Pumped Nd:YAG Laser," *Optics Letters*, vol. 13, No. 4, Apr. 1988, pp. 306–308.

Y. Kaneda, et al., "7.6 W of Continous–Wave Radiation in a $TEM_{00}$ Mode from a Laser–Diode End–Pumped Nd:YAG Laser," *Optics Letters*, vol. 17, No. 14, Jul. 15, 1992, pp. 1003–1005.

N. A. Olsson, et al., "An Optical Switching and Routing System Using Frequency Tunable Cleaved–Coupled–Cavity Semiconductor Lasers," *IEEE Journal of Quantum Electronics*, vol. QE–20, No. 4, Apr. 1984, pp. 332–334.

Japanese Patent Application Abstract, Patent No. 63,148, 692, *Patent Abstracts of Japan*, vol. 12, No. 407 (E–675) Oct. 27, 1988.

(List continued on next page.)

*Primary Examiner*—Leon Scott, Jr.
*Attorney, Agent, or Firm*—Barry R. Lipsitz

[57] ABSTRACT

In order to improve a semiconductor laser system with a plurality of semiconductor laser units, from which laser radiation exits, a light-conducting fiber associated with each semiconductor laser unit, a coupling element for coupling the laser radiation exiting from the respective semiconductor laser unit into the respective light-conducting fiber, and a fiber bundle comprising the fibers as light conductor system, a total laser radiation formed by the sum of the laser radiations generated by the respective semiconductor laser units exiting from one end of this fiber bundle, the total laser radiation illuminating a target surface on an object to be irradiated during laser activity of all the semiconductor laser units, such that complex irradiation tasks can be performed it is suggested that the semiconductor laser units be designed such that they operate relative to one another in a phase-defined and frequency-defined mode operation, that the laser radiation of each semiconductor laser unit be coupled into the respective laser light-conducting fiber with low loss, that each fiber be a single-mode fiber and that in the total laser radiation the laser radiations of several, preferably all of the semiconductor laser units be controllable in their phase independently of one another.

59 Claims, 11 Drawing Sheets

OTHER PUBLICATIONS

Japanese Patent Application Abstract, Patent No. 63,221,688, *Patent Abstracts of Japan*, vol. 13, No. 16 (E–703) Jan. 13, 1989.

Japanese Patent Application Abstract, Patent No. 57,073,718, *Patent Abstracts of Japan*, vol. 6, No. 156 (P–135) Aug. 17, 1982.

Japanese Patent Application Abstract, Patent No. 57,084,189, *Patent Abstracts of Japan*, vol. 6, No. 164 (E–127) Aug. 27, 1982.

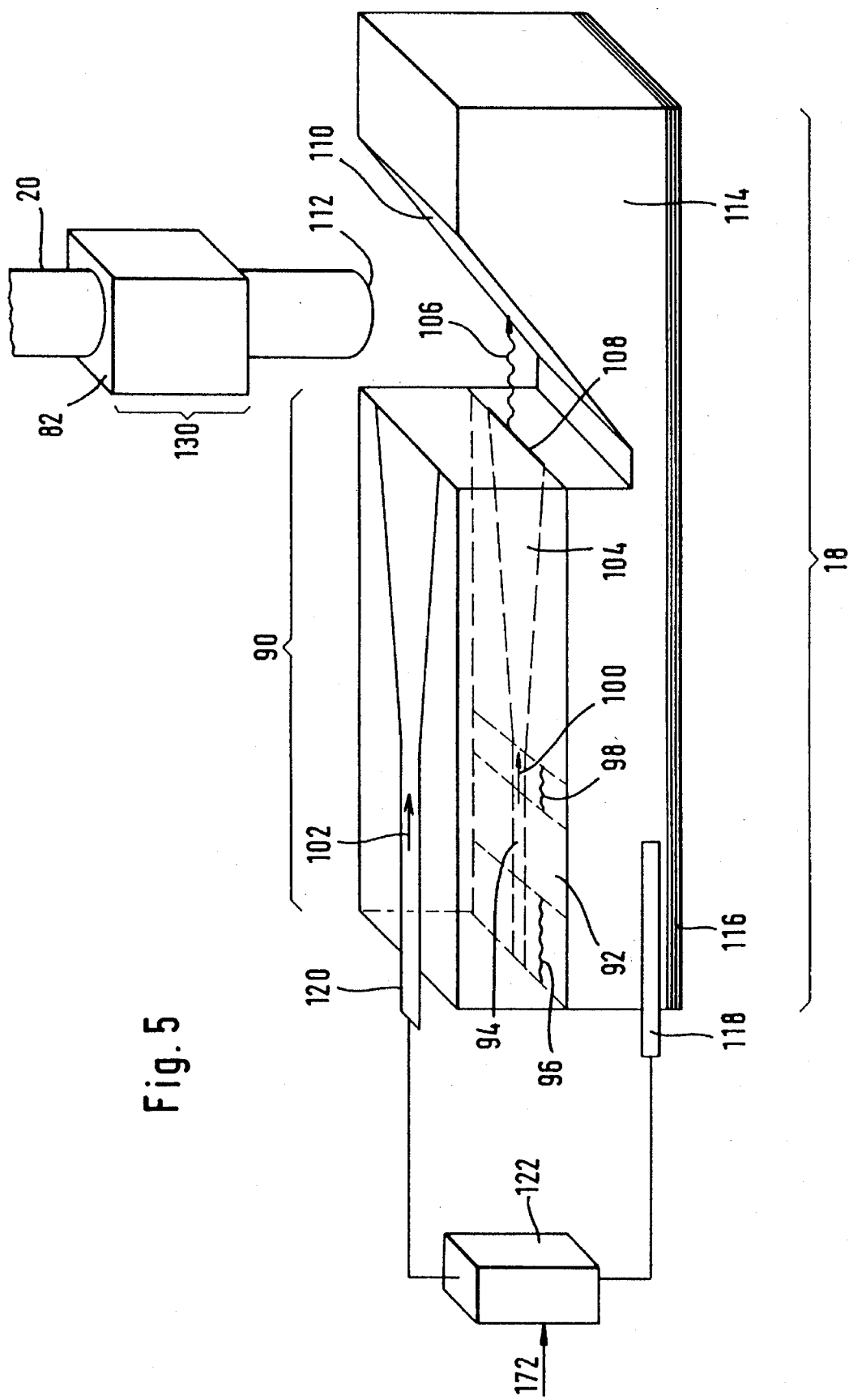

PHASE-CONTROLLED, FRACTAL LASER SYSTEM

The invention relates to a semiconductor laser system with a plurality of semiconductor laser units comprising a laser oscillator, laser radiation exiting from each of these units, a light-conducting fiber associated with each semiconductor laser unit, a coupling element for coupling the laser radiation exiting from the respective semiconductor laser unit into the respective laser light-conducting fiber, and a fiber bundle comprising the fibers as light conductor system, a total laser radiation formed by the sum of the laser radiations generated by the respective semiconductor laser units exiting from one end of this fiber bundle, the total laser radiation illuminating a target surface on an object to be irradiated during laser activity of all the semiconductor laser units.

Semiconductor laser systems of this type are known. For example, seven semiconductor laser systems are directed onto one target surface. The disadvantage is that the total laser radiation merely represents the sum of the individual laser radiations and therefore no complex irradiation tasks are possible.

The object underlying the invention is therefore to improve a semiconductor laser system of the generic type such that complex irradiation tasks can be carried out and, in particular, a total laser radiation is available which is comparable or superior with respect to its radiation strength and properties to the laser radiation used so far, for example in high-power lasers.

This object is solved in accordance with the invention, in a semiconductor laser system of the type described at the outset in that the semiconductor laser units are designed such that they operate in a phase-defined mode operation, that the laser radiation of each semiconductor laser unit is coupled into the respective laser light-conducting fiber with low loss, that each fiber is a single-mode fiber and that in the total laser radiation the laser radiations of several, preferably all of the semiconductor laser units are independently controllable in their phase.

The inventive solution provides the possibility of carrying out a phase adaptation in the laser radiations adding up to the total laser radiation in a fractal laser system and, therefore, of superposing the laser radiations to form the total laser radiation such that the superposition takes place at a predeterminable phase orientation.

This means that synergistic effects can be generated between the laser radiations in the total laser radiation during the summation of the laser radiations and therefore complex irradiation tasks, for example by utilizing interference phenomena between the individual laser radiations, can be accomplished.

It is particularly advantageous for the laser radiation exiting from each semiconductor laser unit to have a laser radiation field independent of the laser radiation of the other semiconductor laser unit with respect to the phase. Due to such a complete independence of the phase of the laser radiation fields of the individual semiconductor units, it is possible in a particularly advantageous manner to control the phase orientations of the individual laser radiation fields in an inventive manner.

It is even more advantageous for the laser radiation exiting from each semiconductor laser unit to be decoupled from the laser radiation of the other semiconductor laser units with respect to the radiation field.

This can be achieved particularly advantageously when the laser radiation of a semiconductor laser unit coupled each time into the light-conducting fiber is decoupled from the laser radiation of the other semiconductor laser units with respect to its radiation field.

This can, for example, be realized in that each of the semiconductor laser units has its own laser oscillator decoupled from the other semiconductor laser units with respect to the radiation field.

Such a decoupling of the radiation fields of the laser oscillators can be realized from a constructional point of view in the simplest way by the laser oscillators of the semiconductor laser units being laser oscillators which are each separate from one another.

The laser radiations of the individual semiconductor laser units could interact again with one another in the total laser radiation and be coupled with one another again via the radiation field. It is, however, advantageously provided for the laser radiations forming the total laser radiation to be decoupled with respect to their radiation fields so that no reciprocal reaction results between the individual radiation fields of the laser radiations but merely a defined control of the phase of the laser radiations of the individual semiconductor laser units so that the phase control in the case of the laser radiation exiting from one semiconductor laser unit has no reactive effect on the phase orientation of the other laser radiations exiting from the other semiconductor laser units.

The inventive solution can be utilized particularly favorably when all the semiconductor laser units operate at the same frequency since in this case all types of interference effects can be attained by corresponding control of the phase orientation.

This can be achieved particularly simply by all the laser units being frequency-coupled.

In order to keep frequency variations as slight as possible, it is provided, in addition, that the semiconductor laser units are frequency-stabilized.

A frequency stabilization can be preferably achieved when it takes place via a frequency control, in particular a temperature and/or current control of the semiconductor laser units.

In addition, a further expedient possibility for frequency stabilization is for each semiconductor laser unit to have at least one individually current-controllable diode zone for the frequency control.

It is particularly expedient for the semiconductor laser units to have a frequency/current characteristic which is such that in each semiconductor laser unit the intended frequency is available with a current variation in a control range between the minimum and the maximum current strength of the semiconductor laser unit.

It is advantageous for the same frequency to be available by means of a current variation in a range of approximately 50% of the control range, even better 20% and best of all 10%.

The adjustment of the frequency/current characteristic is advantageously possible via an attemperating of the respective semiconductor laser unit.

For the attemperating, a heating element is advantageously provided in direct contact with the semiconductor layer, or is a component of the semiconductor layer.

Moreover, in order to achieve a defined mode operation it is provided for the respective semiconductor laser unit to operate in a stabilized mode operation.

In this respect, it is preferable for the respective, preferably each semiconductor laser unit to operate in the transversal basic mode. It is particularly advantageous for the respective, preferably each semiconductor laser unit to operate in the longitudinal single-mode operation.

The most varied of possibilities are provided for the type of phase adjustment.

In one embodiment, the phase adjustment is to be carried out such that the total laser radiation propagates in the form of a definable wave front. In this case, the phase adjustment takes place such that the laser radiations forming the wave front are each time in a defined phase relation relative to one another, for example equal-phase, and also have the same frequency.

In a less complicated embodiment, individual part bundles of the total laser radiation propagate each time in the form of a definable wave front but the part bundles are incoherent amongst themselves. However, the focusability of the total laser radiation is already improved considerably due to this.

How the phase control for each semiconductor laser unit is intended to take place independently of the others has not so far been discussed in detail. For example, it is particularly advantageous in this respect when a phase adjusting means is provided for the laser radiation of each semiconductor laser unit so that with this phase adjustment a phase control can be carried out for each individual semiconductor laser unit independently of the other semiconductor laser units.

It is advantageous for a phase adjustment to take place via two or more than two phase adjusting means, whereby a first phase adjusting means has a first time constant and a second phase adjusting means a second time constant, the latter being, for example, smaller than the first.

Where the phase adjustment means can be arranged has so far likewise been left open. One possibility of providing a phase adjustment means is for the phase adjustment means to comprise a control of the semiconductor laser unit.

It is particularly expedient for the control to comprise a current control of the semiconductor laser unit. Moreover, it is also in some cases of advantage for the control to comprise a temperature regulation for the semiconductor laser unit.

A phase adjustment means can be integrated particularly advantageously when a semiconductor laser unit has at least two individually current-controllable diode zones having different dependences of the refractive index on the diode current, one of these zones operating as an element of the phase adjusting means.

In this respect, this is preferably the diode zone which does not form the laser oscillator but preferably the laser amplifier so that the frequency stabilization takes place via the laser oscillator while a phase adjustment is possible via the diode zone of the laser amplifier.

In a further alternative of an inventive phase adjusting means, this comprises a phase variation member arranged in the fiber so that the phase variation can be carried out in the fiber by way of the phase adjustment means.

The phase variation member is expediently arranged in the end region of the fiber adjoining the semiconductor laser unit in order to make it possible for a control of the phase variation member to be carried out partially together with the control of each individual semiconductor laser unit.

The phase variation member is preferably constructed such that it is formed by an active fiber section.

In an advantageous possibility, a phase adjustment can be generated in the active fiber section by means of an electrooptical or magnetooptical effect.

Alternatively thereto, a phase adjustment can be generated in the active fiber section by means of a change in temperature of this section.

A further possibility of providing a phase adjustment means is for the phase adjustment means to comprise a phase variation member arranged between the semiconductor laser unit and the single-mode fiber. A phase variation member of this type is preferably arranged between the semiconductor laser unit and one end of the single-mode fiber facing this unit, i.e. also near to the semiconductor laser unit so that a control of the phase adjusting means with this phase variation member can take place likewise in conjunction with the control of the semiconductor unit.

For example, in an expedient arrangement of the phase variation member, this is arranged between the semiconductor laser unit and one end of the single-mode fiber facing this unit.

In this respect, the phase variation member is preferably also designed such that it comprises an electrooptical or magnetooptical unit.

Alternatively thereto, it is also possible for the phase variation member to comprise a temperature-dependent unit.

In a preferred possibility, the phase variation member has a polarization-turning means.

With respect to coupling the laser radiation into the single-mode fibers, no further explanations have so far been given. For example, it is particularly expedient for the laser radiation to be coupled into the single-mode fibers with limited diffraction to keep losses as low as possible.

With respect to the detection of the phase for the phase control, no further details have likewise been given in conjunction with the previous embodiments. For example, a particularly advantageous embodiment provides for a phase detector for the laser radiation of each semiconductor element to be arranged at one end of the fiber bundle.

The phase detector is preferably constructed such that it comprises an interferometer since a phase detection is possible with an interferometer by means of relatively simple detection procedures.

In a particularly advantageous solution for a phase detector, the phase orientation of the laser radiation of each semiconductor element is compared therein with the phase orientation of a reference laser radiation which is generated by a semiconductor laser unit operating at the same frequency. It is then possible to determine the phase orientation in a simple manner by interference of the laser radiation and the reference laser radiation.

This may be realized particularly simply when the phase detector has a coupling-out element for coupling part of the laser radiation of each semiconductor laser unit out of the total laser radiation.

In addition, measurement of the phase orientation of the laser radiation of each individual semiconductor laser unit can be carried out particularly effectively when the phase detector comprises a detector matrix, whereby at least one selectively interrogatable matrix element receives only the laser radiation of one respective semiconductor laser unit and the reference laser radiation. By providing a detector matrix, it is possible to simultaneously measure the phase orientations of all the semiconductor laser units and, therefore, to regulate the phase orientations very quickly via the phase control.

The determination of the phase orientation in the phase detector can be carried out particularly advantageously when the reference laser radiation is power or phase modulated.

This power modulation can be favorably carried out when the reference radiation is modulated by a modulator, preferably a chopper.

The phase modulation can, for example, be carried out via one of the possibilities as described for the phase control.

The evaluation of the phase orientation can be carried out particularly advantageously when the phase detector is connected to an evaluation circuit which determines the phase orientation of the laser radiation in the total laser radiation and controls the phase orientation of the laser radiation of each individual semiconductor laser unit in the total laser radiation such that the phase orientation of the respective laser radiation in the total laser radiation can be specified in a defined manner.

In addition hereto, it is also advantageous when the power of the laser radiation of each individual semiconductor laser unit can be measured with the evaluation circuit and controlled via the control of the semiconductor laser unit.

In this respect, it is particularly advantageous for the evaluation circuit of the phase detector to detect the variations in power at each matrix element for determining the phase orientation.

The power of each individual semiconductor laser unit can be determined particularly advantageously in the phase detector when the reference laser radiation is power modulated since the signal of the phase detector at power zero of the reference laser radiation is then a direct measurement for the power.

The evaluation circuit is, in addition, expediently connected to a phase control via a bus system, whereby one or more additional fibers can, for example, serve for the data transmission.

Moreover, the evaluation of the means is also expediently connected via a bus system to a frequency control for the individual semiconductor laser units.

With respect to the design of the light conductor system in the region of the end thereof, no additional details have so far been given. It is, for example, preferably provided that in the region of the end of the light conductor system fiber end faces of the single-mode fibers, from which the laser radiation of the associated semiconductor laser unit exits, are located in an end surface of the light conductor system which can be optically imaged onto the target surface.

The fiber end faces can, in this respect, have a space between them which is preferably smaller than three times the fiber thickness; it is even better for the space to be smaller than twice the fiber thickness. In the extreme case, the fiber end faces can be located next to one another in the end surface and, in particular, border on one another.

With respect to the type and shape of the end surface, no details have as yet been given. It is, for example, provided that the shape of the end surface is adapted to a shape of the surface of the object to be irradiated in the region of the target surface.

The fiber end faces are preferably arranged such that the total laser radiation has phase fronts which are predeterminable in a defined manner and from which distributions of intensity which are predeterminable in a defined manner result on the target surface.

In the simplest case, the fiber end faces are essentially arranged in a plane forming the end surfaces.

In addition, the arrangement of the fiber end faces in the end surface forms the possibility of obtaining an adaptation to optical imaging properties of the optical imaging means due to the shape of the end surface.

Furthermore, it is preferable for an optical imaging means to be provided between the end surface of the light conductor system and the target surface in order to obtain a good imaging of all the fiber end faces onto the target surface.

Due to the fact that a phase control is possible with the inventive solution, it is also possible to generate imaging properties of the optical imaging means by phase control of the individual laser beams forming the total laser beam, for example to correct imaging errors.

Moreover, it is possible according to the invention to predetermine position and shape of the target surface by phase control of the laser beams of the total laser radiation.

With respect to the type of semiconductor laser units, no more exact details have so far been specified. In one embodiment, for example, each semiconductor laser unit has each time a single laser-active diode strip.

In this respect, the laser radiation can propagate either in a plane, in which the laser strip extends, which is, for example, the case with conventional laser diodes, or approximately vertically thereto, which is the case with vertical emitters.

Alternatively or additionally thereto, it is advantageous for each semiconductor laser unit to comprise a coupled array of laser-active diode strips operating in the basic mode.

With respect to the construction of the semiconductor laser unit, no additional details have so far been specified. In a particularly preferred embodiment, for example, each semiconductor laser unit comprises a laser oscillator and a laser amplifier which are preferably integrated into the same semiconductor layer.

Moreover, it is also expedient for each semiconductor laser unit to be mode-stabilized by a strip grating.

Alternatively to the active frequency stabilization of each individual semiconductor laser unit, as explained in the preceding embodiments, for example via interference with a reference laser radiation, an additional, advantageous embodiment provides for all the semiconductor laser units operating at the same frequency to comprise a common laser oscillator generating a base laser radiation which is amplified by each semiconductor laser unit by means of its own laser amplifier to form the laser radiation of the respective semiconductor laser unit and from there is coupled into the single-mode fiber associated with the respective semiconductor laser unit. The advantage of this system is to be seen in the fact that by providing a single, common laser oscillator for all the semiconductor laser units, the frequency stability between the laser radiations of the individual semiconductor laser units is already predetermined so that no additional measures need be taken in this case for the frequency stabilization.

In order to be able to feed the base laser radiation to the individual laser amplifiers, beam splitters are provided in an advantageous manner for coupling the base laser radiation into the respective laser amplifier as branch radiation.

In order to avoid radiation losses, a beam shaping optical means is advantageously provided which reshapes the divergent base laser radiation into a base laser radiation propagating as a plane wave.

Furthermore, it is advantageous in addition thereto for a beam shaping optical means to be provided which images the branch radiation coming from the beam splitters onto the laser amplifier.

With respect to the coupling element for coupling the single-mode fibers, no further details have so far been given. It has, for example, proven to be particularly advantageous for the coupling element for coupling the single-mode fiber to the semiconductor laser unit to comprise an imaging element borne by the substrate of the semiconductor laser unit.

The imaging element is preferably designed such that it focuses the laser beam propagating in the direction parallel to the layer planes of the semiconductor onto the single-mode fiber.

In the simplest case, the imaging element is a grating integrated into the substrate, whereby the grating is expediently a reflection grating.

Alternatively thereto, it is conceivable for the imaging element to be a mirror integrated into the substrate, whereby the mirror is favorably designed to focus the laser radiation likewise onto the single-mode fiber.

In an additional, alternative solution, the imaging element is a lens integrated into the substrate, whereby the lens is preferably an index lens.

Alternatively or additionally to the use of a mirror or a lens, it is provided for the imaging element to be a holographic-optical element.

The inventive laser system preferably provides for the use of a plurality, for example several tens or hundreds, of semiconductor laser units having powers from 1 to 3 watts in order to obtain powers of the total laser radiation of several hundred or even more than one thousand watts.

In an additional, advantageous embodiment of the inventive semiconductor system, the fiber bundle comprises detector fibers, whereby the detector fibers serve, in particular, to observe the target surface.

In this respect, it is preferable for an end of the detector fibers to be located at the end of the light conductor system.

In order to obtain the same imaging ratios as in the case of the total laser radiation, it is advantageous for the end of the detector fibers to be located in the end surface next to the fiber end faces so that the fiber end faces of the detector fibers are likewise located in the end surface.

It is particularly favorable when the ends of the detector fibers lie distributed between the fiber end faces.

This means that it is advantageously possible, when using an optical imaging means, to image the target surface onto the ends of the detector fibers.

Moreover, the target surface can be observed particularly easily in that an optical detector is arranged at another end of the detector fibers for observing the image surface.

This detector is preferably designed as a matrix detector and the detector fibers are preferably associated with the individual matrix points of the matrix detector such that with their fiber end faces a direct imaging of the target surface onto the matrix detector is possible.

In this respect, it is particularly expedient for a control to be provided which observes the intensity distribution in the target surface via the matrix detector and ensures a locally fixed radiation onto the object to be irradiated within the target surface due to a defined specification of the phase and, if required, also of the power for the individual semiconductor laser units.

In conjunction with the explanation of the embodiments described thus far, no details have been given as to the wavelength ranges, for which the semiconductor laser units are designed. In the simplest embodiment, for example, all the semiconductor laser units are designed for the same wavelength range.

It is, however, also conceivable for different semiconductor laser units to be designed for different wavelength ranges.

In this respect, it is particularly expedient for the semiconductor laser units to comprise a group of semiconductor laser units with the same wavelength.

In an additional, advantageous embodiment, the semiconductor laser units comprise several groups of semiconductor laser units having the same wavelength within the respective groups.

In a case of this type, it is particularly advantageous for the fiber end faces of fibers irradiating laser radiation of differing wavelength to be combined to form a respective irradiation group and for the irradiation groups to be arranged next to one another in the end surface. In such an embodiment, the marking and beam visualization can be realized particularly advantageously since, in this case, only one group of semiconductor laser units need be configured such that it generates laser radiation with a wavelength lying in the visible range.

In this case, the other group of semiconductor laser units can preferably be configured such that it, for example, generates the laser radiation required for the irradiation or processing.

In a further, inventive semiconductor laser system, in particular a system comprising semiconductor laser units which are frequency-adjustable individually, an additional, advantageous operating mode is possible when the semiconductor laser units each generate a laser radiation having frequencies forming a sequence of frequencies with a constant frequency interval and laser radiation having the same phase orientation at a defined point of time (mode-locked). In such a semiconductor laser system, defined, timed intensity fluctuations can be generated in a simple manner.

In this respect, it is particularly advantageous for one respective group of semiconductor laser units to generate laser radiation having the same frequency and for the fiber end faces of the respectively associated single-mode fibers to be arranged relative to one another in predeterminable geometric symmetries such that part bundles are present in the total laser radiation which have this symmetry but a different frequency.

The desired frequency intervals of the sequence of frequencies can preferably be generated with a pulse generator and made available to the frequency stabilization.

Additional features and advantages of the invention are the subject matter of the following description as well as the drawings of several embodiments.

In the drawings:

FIG. 5 is a schematic illustration of a semiconductor laser unit with a phase adjusting means;

Figure 1:
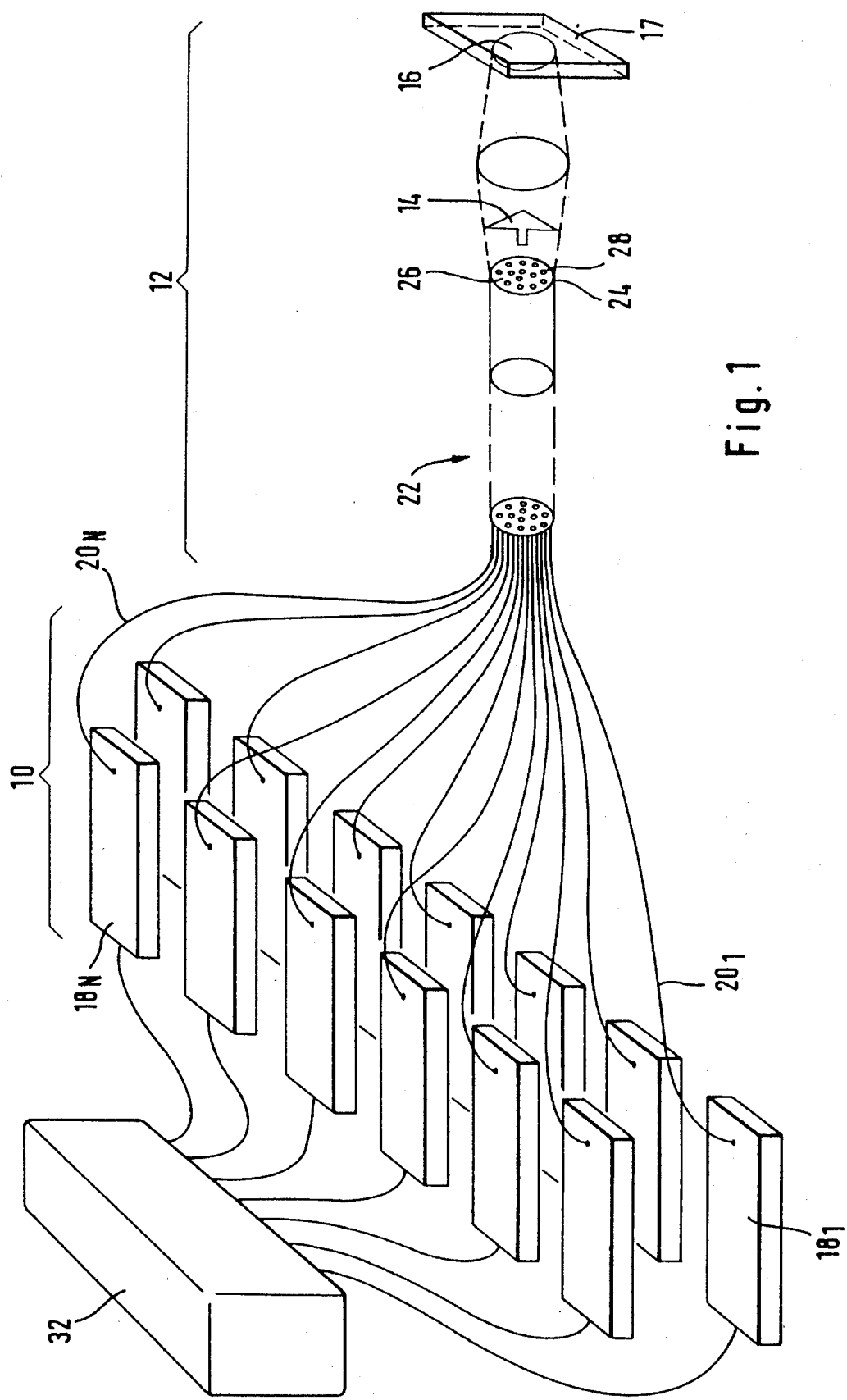
FIG. 1 is a schematic illustration of a first embodiment of an inventive semiconductor laser system.

A first embodiment of an inventive semiconductor laser system, illustrated in FIG. 1, comprises a first variation of a radiation generator system 10 followed by a light conductor system 12 which emits a total laser radiation 14 which, for its part, impinges on a target surface 16 of an object 17 to be irradiated.

Figure 2:
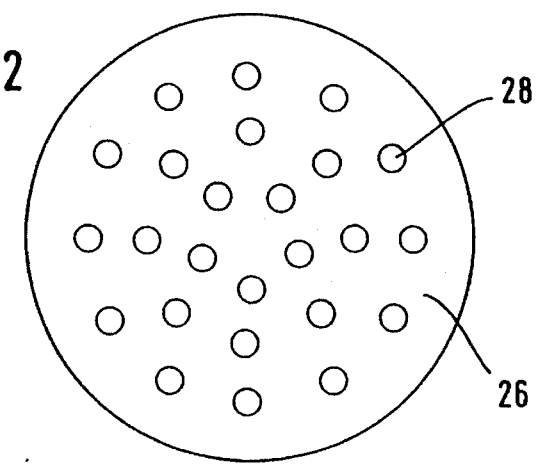
FIG. 2 is a plan view onto an end surface of the light conductor system in the first embodiment.

The radiation generator system 10 comprises, for its part, a plurality of semiconductor laser units $18_{1\ to\ N}$, each of which generates laser radiation and in which the laser radiation is coupled into a respective single-mode fiber $20_{1\ to\ N}$. All the single-mode fibers $20_{1\ to\ N}$ are combined to form a fiber bundle 22 which is then encompassed by the light conductor system 12 and has an end 24, from which the total laser radiation 14 exits. At the end 24, as illustrated in FIGS. 1 and 2, all the fiber end faces 28 of the single-mode fibers 20 are preferably located in an end surface 26.

All the semiconductor laser units $18_{1\ to\ N}$ can be operated via a control such that they are frequency stabilized to operate at the same frequency and, moreover, a phase orientation of the laser radiation can be predetermined in a defined manner. In this respect, the phase orientation is specified by means of the control 32 such that the superposition of the laser radiations of several or all of the semiconductor laser units 18, this superposition proceeding from the fiber end faces 28 and propagating as total laser radiation 14, leads to the total laser radiation 14 which propagates with a definable, for example a plane, wave front.

In order to be able to determine the phase orientation of the laser radiation of each individual semiconductor laser unit at each individual fiber end face 28 (FIG. 3), the light conductor system 12 is provided with a phase detector 40 which comprises a beam splitter, preferably a diffractive reflector 42, and an imaging element for part of the total laser radiation 14. In this respect, the diffractive reflector is arranged at a distance from the end surface 26 and in front of as well as facing this end surface 26 so that the total laser radiation 14 passes through it and is partially reflected by it. It is particularly favorable when the diffractive reflector 42 serves at the same time as imaging element so that an additional optical imaging means can be dispensed with.

Part of the total laser radiation 14 is imaged by the diffractive reflector 42 onto two detector surfaces 44 and 46 of two matrix detectors 48 and 50, respectively, whereby at least one matrix element 52 or 54 of each respective detector surface 44 or 46 is clearly allocated to a respective fiber end face 28. This is equivalent to a clear association of at least one matrix element 52 or 54 with one of the respective semiconductor laser units 18.

This means that it is possible by means of each matrix element 52 or 54 to detect the intensity of the laser radiation generated by the respectively associated semiconductor laser unit 18 due to the diffractive reflector 42.

However, in order to detect the phase orientation of the laser radiation of each of the semiconductor laser units 18 by means of the matrix elements 52 or 54, a fiber end face 56 of a reference fiber 58 is provided next to the diffractive reflector. This is likewise connected to a semiconductor laser unit 18R, whereby the semiconductor laser unit 18R is identical to the remaining semiconductor laser units 18 and, in particular, operates with the same frequency but is not, however, controlled with respect to its phase orientation but itself supplies a reference phase orientation.

The reference phase orientation of the semiconductor laser unit 18R is detectable by each of the matrix elements 52 or 54 in that a spherical wave propagates from the fiber end face 56, whereby this spherical wave covers both the entire detector surface 44 and the detector surface 46.

Thus, each of the matrix elements 52 or 54 of the detector surfaces 44 or 46 receives, apart from the laser radiation of the respectively associated semiconductor laser unit 18 which is reflected from the diffractive reflector 42, the laser radiation of the semiconductor laser unit 18R of the reference radiation, whereby the two laser radiations interfere with one another and therefore, according to their phase orientation relative to one another, an intensity maximum and an intensity minimum are detectable at the respective matrix element 52 or 54.

An additional modulation of the laser radiation emitted from the fiber end face 56 of the reference fiber 58 with a modulator 60 makes it possible, in addition, to carry out an intensity measurement of the laser radiation of each semiconductor laser unit with each of the matrix elements 52 or 54. This is likewise of significance for the measurement of the phase orientation with a view to checking whether laser radiation is in fact generated by the respective semiconductor laser unit $18_{1\ to\ N}$.

Moreover, the diffractive reflector 42 is designed such that it reflects the laser radiation from each of the individual fiber end faces 28, dependent on polarization, either to the detector surface 44 or to the detector surface 46 so that a comparison of the matrix elements 52 and 54, which are each associated with one fiber end face 28 and therefore with one semiconductor laser unit 18, allows the polarization to be determined in addition to the phase orientation.

The measurements of intensities at the individual matrix elements 52 or 54 on the detector surfaces 44 or 46 give particularly good results when the intensity of the laser radiation reflected by the diffractive reflector 42 and the intensity of the laser radiation emitted from the fiber end face 56 of the reference fiber 58 are approximately the same in each matrix element 52 or 54. In addition, during the measurements by way of the individual matrix elements 52 or 54 a difference in distance from the laser radiation exiting from the fiber end face 56 to the individual matrix elements 52 is to be taken into consideration and, furthermore, a difference in distance between each of the fiber end faces 28 and the corresponding matrix element 52 or 54 via the diffractive reflector 42. These differences in distance result in additional displacements of the phase orientations so that these differences must be considered when the same phase orientation is intended to be provided with the phase detector 40 at all the fiber end faces 28, namely in the end surface 26.

The matrix detectors 48 and 50 are preferably designed as CCD cameras, each pixel of which represents a matrix element 52, 54.

Figure 3:
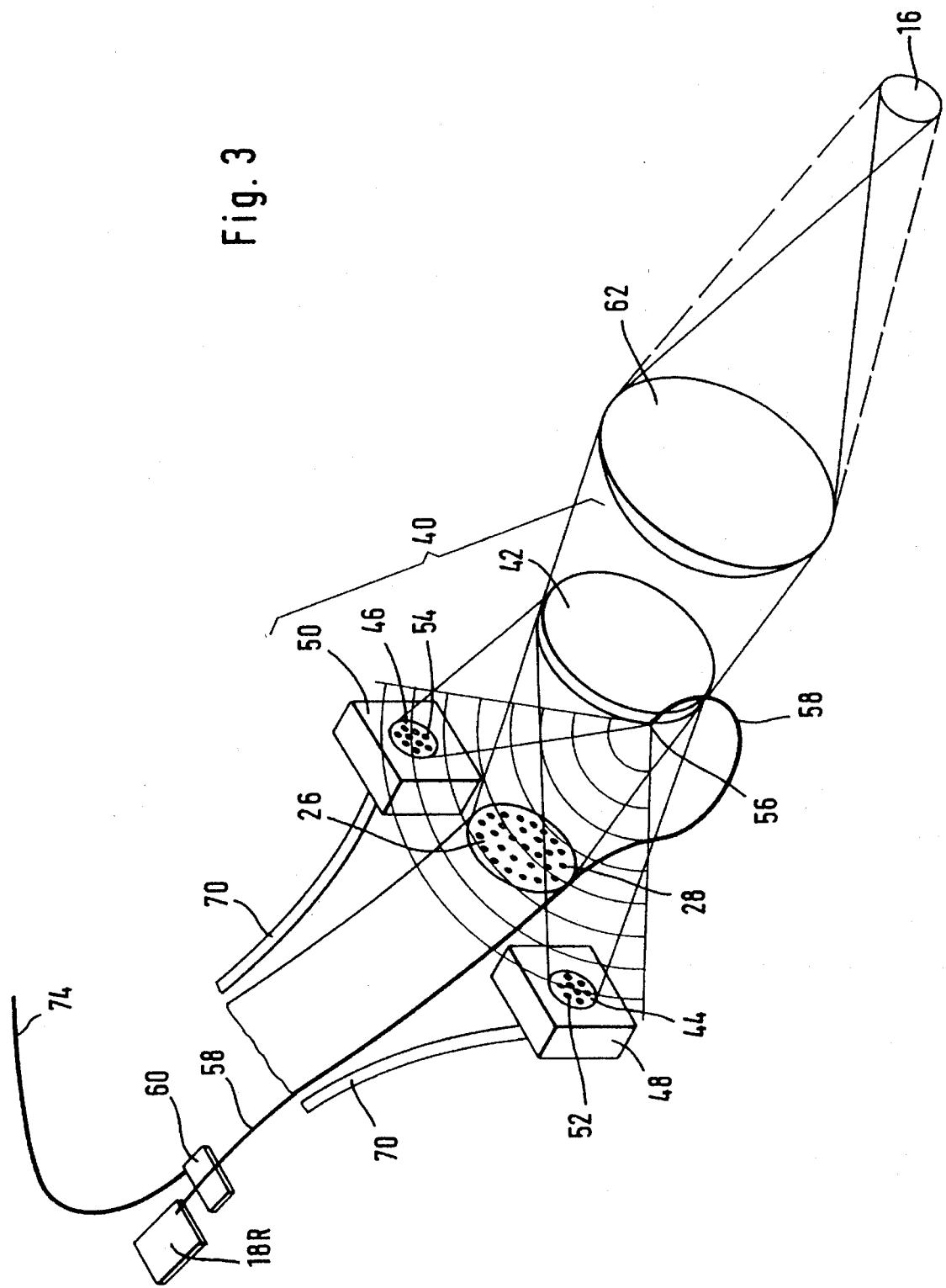
FIG. 3 is a schematic illustration of an inventive phase detector.

As also illustrated in FIG. 3, the diffractive element is followed by an optical imaging means 62 which images the total laser radiation 14 onto the target surface 16, whereby the optical imaging means 62 is preferably designed such that a coherent imaging, i.e. an imaging of the phase-correlated total laser beam 14, results. This is, in the simplest case, mostly an imaging into the focal plane of the optical imaging means 62, i.e. the target surface 16 is preferably located in the focal plane.

The actual control of the phase orientation of the laser radiation, which is guided by the single-mode fibers 20, takes place in the region of the radiation generator system 10.

Each of the matrix elements 52 and 54 of the matrix detectors 48 and 50 therefore represents one of the fiber end faces 28 in the end surface 26 and thus the laser radiation of a semiconductor laser unit 18 so that it is its phase orientation which can be detected.

In the simplest case, the matrix detectors 48 or 50 have exactly as many matrix elements 52 or 54 as there are fiber end faces 28 in the end surface 26. For example, there are likewise exactly N matrix elements 52 or 54.

Figure 4:
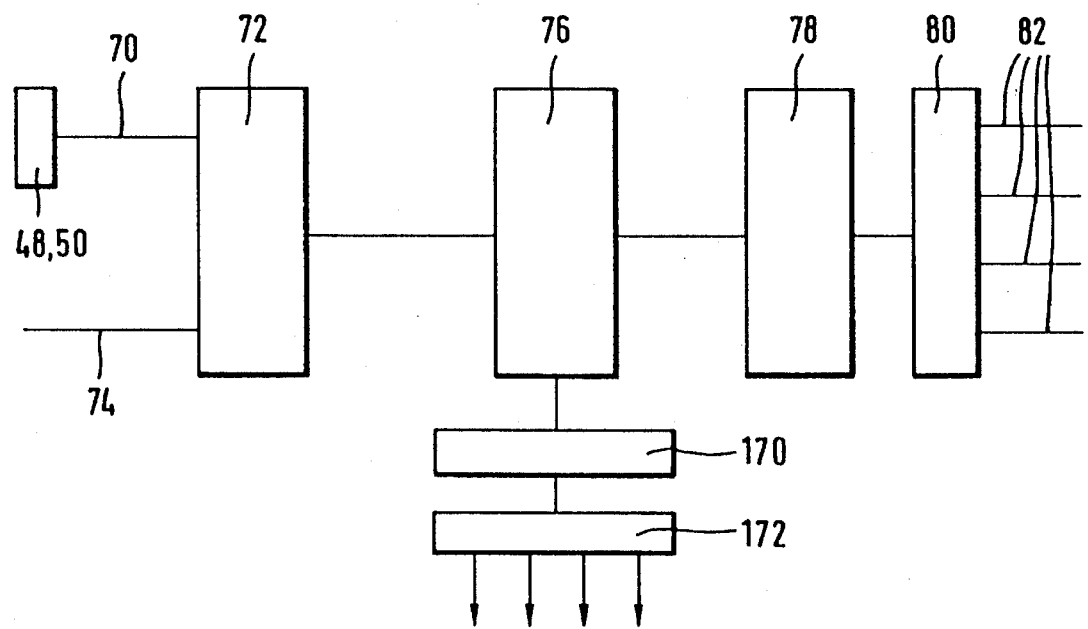
FIG. 4 is a schematic illustration of the control.

The intensities measured by all $52_{1\ to\ N}$ or $54_{1\ to\ N}$ matrix elements are constantly read from the respective matrix detectors 48 or 50 and recorded by a computer unit 72 via a read-out line 70, the computer unit determining the phase orientation from the intensities detected by the respective matrix elements 52 or 54. For this purpose, the computer unit 72 is fed a synchronizing signal in addition via a line 74, this signal indicating the state of the modulator 60 (FIG. 4). In the simplest case, the modulator 60 is a chopper which switches the laser radiation of the semiconductor laser unit 18R on and off at regular intervals.

The phase orientation determined by the computer unit for each of the semiconductor laser units $18_{1\ to\ N}$ is supplied via a bus system 76 to a phase control 78 which, in turn, controls a plurality of phase adjusting means $82_{1\ to\ N}$ via a bus system 80. Each phase adjusting means $82_{1\ to\ N}$ is associated with a respective semiconductor laser unit 18 in order to set the phase of the laser radiation generated by this semiconductor laser unit 18 in accordance with the specifications of the phase control 78 and therefore correlate the phase orientations of all the semiconductor laser units $18_{1\ to\ N}$ with one another such that these phase orientations lead to the predetermined phase distribution in the end surface 26 of the light conductor system 12.

The function of such an inventive phase adjusting means 82 will be described in the following in conjunction with a semiconductor laser unit 18 used by way of example.

Each of the semiconductor laser units 18 comprises a laser diode designated as a whole as 90 which has a laser-active layer 92 which can be produced by corresponding doping (FIG. 5). A laser oscillator 94 is arranged in this laser-active layer 92 and this is formed by a strip of the laser-active layer.

Phase gratings 96 and 98 are provided at the ends of the laser oscillator 94 and these allow a mode-stabilized operation of the laser oscillator 94. The laser oscillator 94 is preferably a laser oscillator which can be stabilized transversally in the basic mode as well as longitudinally in the single-mode operation and in which laser radiation 100 propagates in a longitudinal direction 102.

In the longitudinal direction 102, the laser oscillator 94, namely one end thereof, is followed by a laser amplifier 104 which is likewise integrated into the laser-active layer 92 and in which a laser radiation 106 propagating divergently in the plane of the laser-active layer is formed. This laser radiation exits from one end 108 of the laser-active layer 92 located opposite the laser oscillator 94.

The laser radiation 106 thereby impinges on a coupling element 110 which couples the laser radiation 106 with limited diffraction into one end 112 of the single-mode fiber 20 associated with the respective semiconductor laser unit. The coupling-in with limited diffraction means that the aperture angle with which the laser radiation 106 is reflected onto the end 112 is such that only the basic mode is formed in the interior of the single-mode fiber 20.

In the simplest case, the coupling element 110 is a reflecting element which has, in addition, focusing properties. This can, for example, be a grating, in particular a reflection grating or even a holographically optical element.

Alternatively hereto, it is, however, also conceivable to use a mirror reflecting onto the end 112 of the single-mode fiber as coupling element.

It is particularly advantageous within the scope of the embodiment described for the coupling element 110 to be borne by a substrate 114 which, at the same time, represents the substrate for the laser diode 90. In this case, coupling element 110 and the laser diode 90 can be constructed in a simple manner on the same substrate 114 and realized in miniature form.

So that the laser oscillator 94 operates with a defined frequency, the laser diode 90 is preferably provided with a temperature stabilization 116 which exactly stabilizes the temperature of the substrate 114. In addition, the laser diode 90 is provided with two current supply lines 118 and 120, whereby the current supply line 118 leads to the substrate 114 and the current supply line 120 to a surface contact on the laser diode 90.

A further stabilization of the frequency of the laser oscillator 94 takes place, in addition, via the current supplied through the current supply lines 118 and 120 and the voltage applied via the laser-active layer 92. Both take place via a current/voltage control 122 for each individual laser diode 90.

In addition to the measurement of the phase orientation by means of the matrix detectors 48 or 50, it is also possible to measure the frequency of the individual semiconductor lasers $18_{1\ to\ N}$ relative to the frequency of the semiconductor laser 18R, namely due to the fact that the interference of the laser radiation of the semiconductor laser 18R with the laser radiation of each of the individual semiconductor lasers 18 in the region of the matrix elements 52 or 54, at the intensity measured by the matrix elements 52 or 54, leads to the occurrence of a beat frequency when the frequencies of the laser radiations are not identical. If one of the matrix elements 52 or 54 detects a modulation of the intensities with the beat frequency, then a frequency stabilization of the respective laser oscillator 94 is to be carried out first of all in that the frequency of the laser oscillator 94 is altered via its current/voltage control 122 and, if required, its temperature stabilization 116 until this beat frequency no longer occurs at the measured intensity at each matrix element 52 or 54 (FIG. 5).

This beat frequency may also be ascertained by the computer unit 72. This then controls a frequency control 170 via the bus system 76. This frequency control, for its part, again controls the individual current/voltage controls 122 and the individual temperature stabilizations 116 of the individual semiconductor laser units 18 via a bus system 172 in order to vary the frequency of the laser oscillator 94 to the desired extent.

One embodiment of an inventive phase adjusting means 82 is arranged in a region of the single-mode fiber 20 facing the end 112. In the simplest case, this comprises a phase adjusting element with an element for heating the material of the single-mode fiber 20 in a section 130 which causes the refractive index of the material of the single-mode fiber 20 to alter in the region of the section 130 and therefore the phase orientation of the laser radiation penetrating the section 130 can also be altered.

For example, the section 130 can be heated by coupling in high frequency via a coil.

Figure 6:
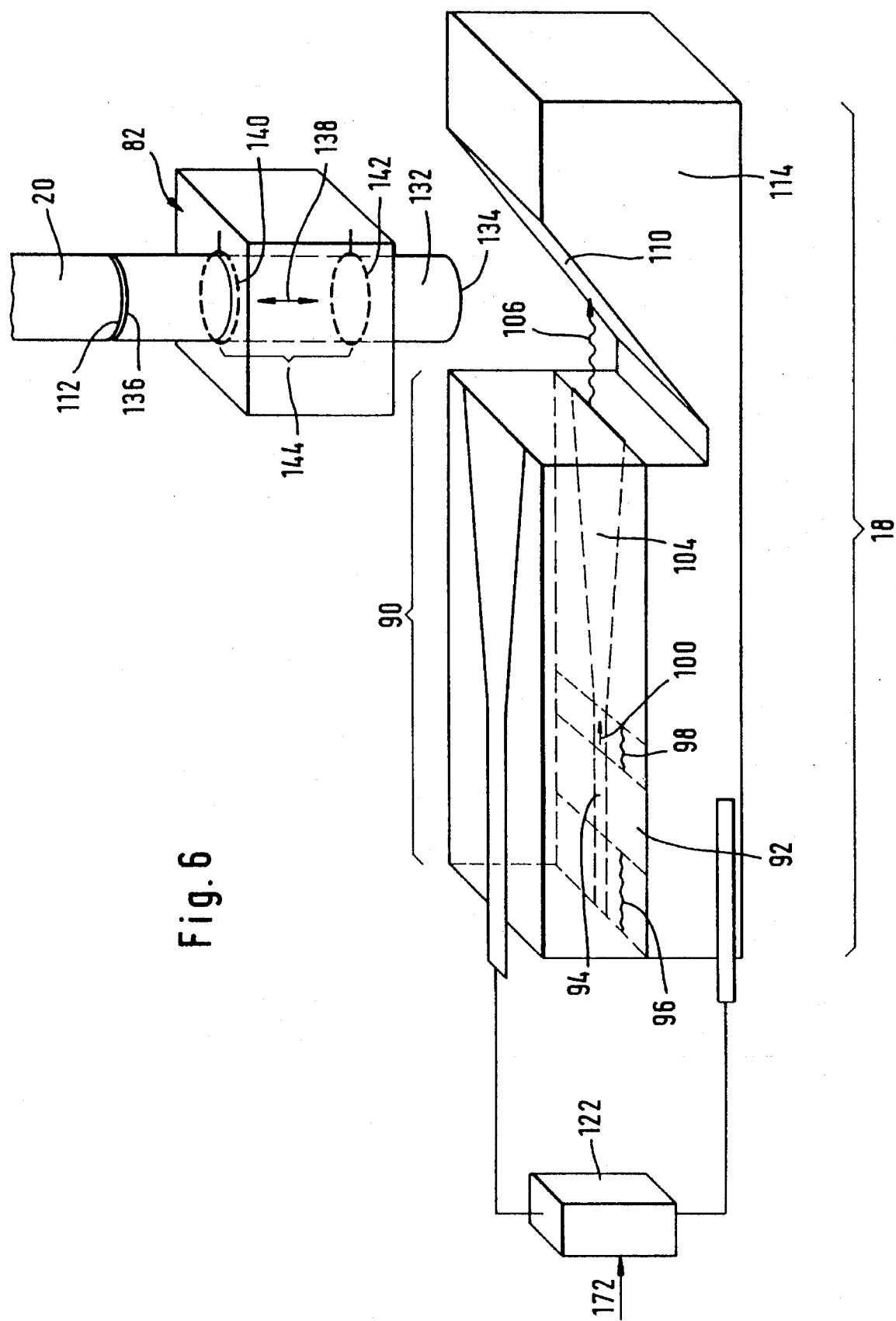
FIG. 6 is a second variation of a phase adjusting means.

In a second embodiment of a phase adjusting element, illustrated in FIG. 6, a fiber element 132 made from a material displaying a Pockels effect and having the same diameter as the single-mode fiber 20 is seated in front of the end 112.

The laser radiation 106 is coupled via the coupling element 110 into an end 134 of the fiber element 132 which is located on the opposite side to the end 136 of the fiber element 132 following the end 112. The end 136 of the fiber element 132 follows directly on from the end 112 of the single-mode fiber so that the laser radiation is transferred from the fiber element 132 directly into the single-mode fiber 20.

The fiber element 132 bears, for its part, two contacts 140 and 142 which are arranged in spaced relation to one another in longitudinal direction 138 of this element and enclose between them a section 144 of the fiber element. By applying a voltage between the contacts 140 and 142, a Pockels effect occurs in the section 144, by means of which the phase orientation of the laser radiation 106 penetrating this section can be varied.

As for the rest, the second embodiment is of an identical design to that of the first so that, in this respect, reference can be made to the comments on the first embodiment.

Figure 7:
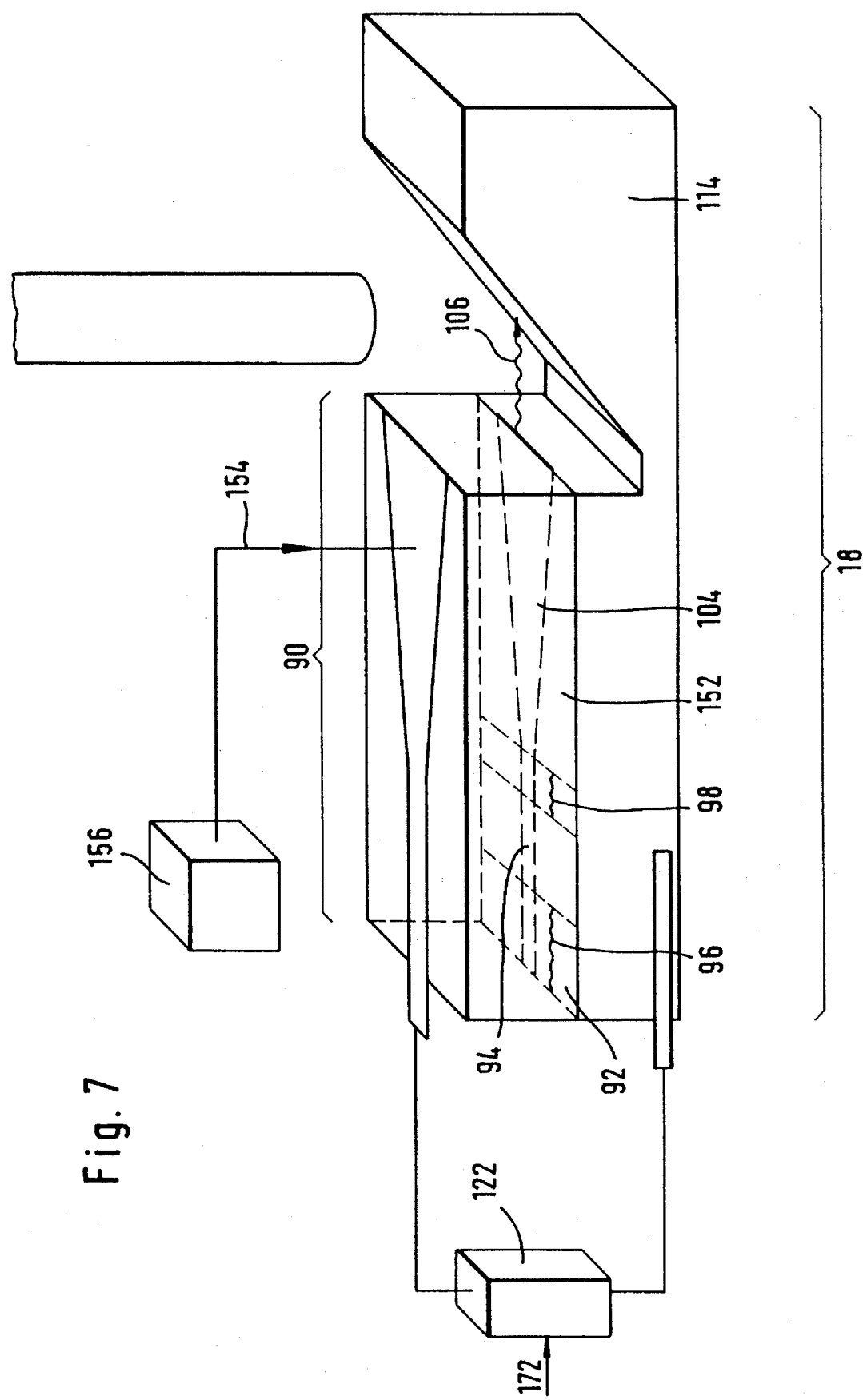
FIG. 7 is a third variation of a phase adjusting means.

A third embodiment of an inventive phase adjusting element is, as illustrated in FIG. 7, integrated into the laser diode 90. In this third embodiment, the laser-active layer 92 of the laser oscillator 94 is separated from the laser-active layer 152 of the laser amplifier 104 and, in addition, a separate contact line 154 is provided for the operation of the laser amplifier 104.

It is therefore possible, due to a separate current and voltage regulation 156 for the laser amplifier 104, to alter the refractive index in the laser-active layer 152 belonging to the laser amplifier 104 by variation of current and voltage in this laser-active layer and, therefore, already alter the phase orientation of the laser radiation 106 within the laser amplifier 104.

In addition, the laser-active layer 152 is of a different construction to the laser-active layer 92 of the laser oscillator 94; it preferably has a different refractive index so that it is possible to control the phase orientation in a simple manner via the current control in the laser-active layer 152.

Figure 8:
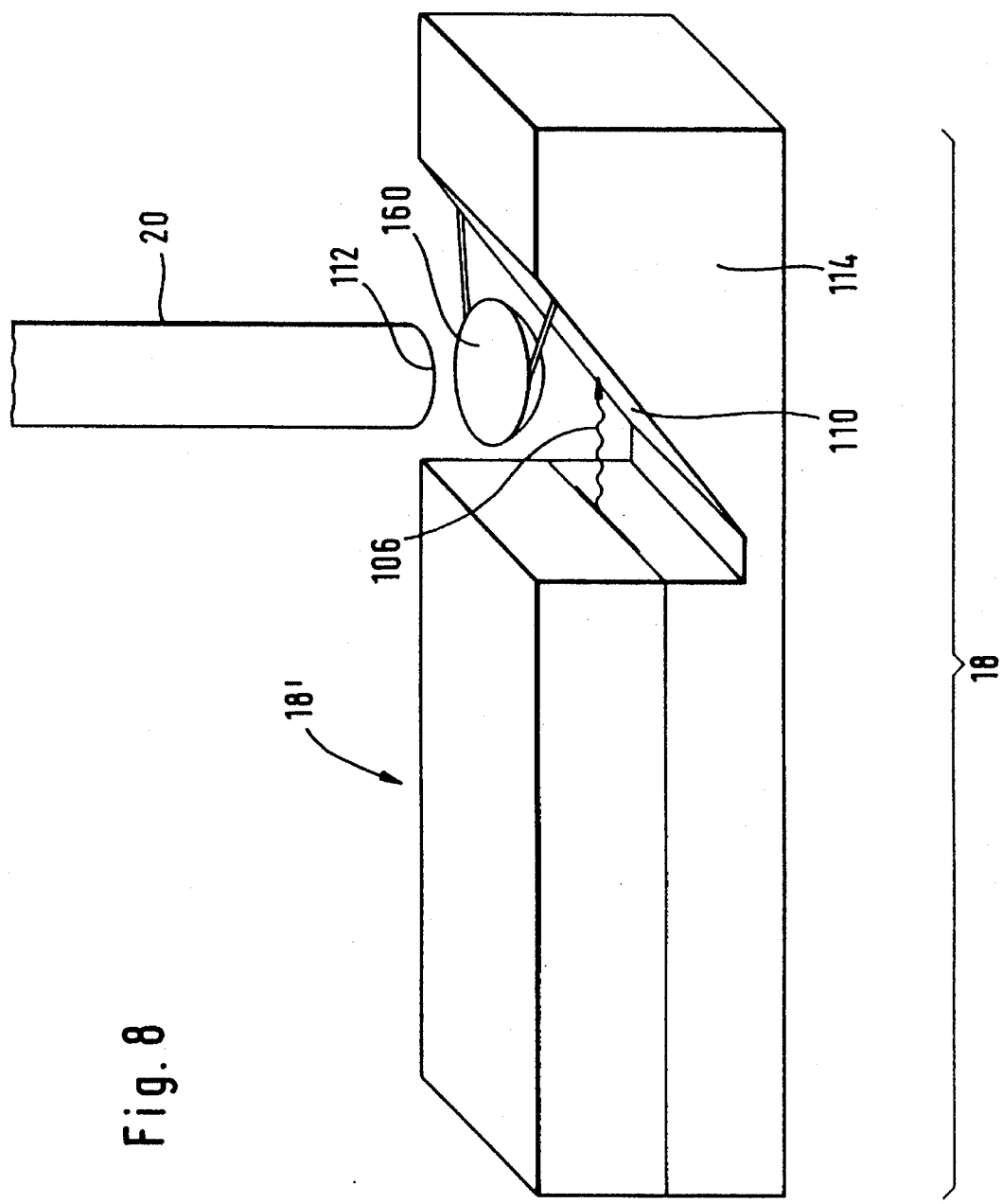
FIG. 8 is an illustration similar to FIG. 5 of a second embodiment of a semiconductor laser unit.

In a further embodiment of an inventive semiconductor laser unit 18', illustrated in FIG. 8, the coupling element 110 is merely designed as a reflecting surface and the focusing, in particular the diffraction-limited coupling of the laser radiation 106 into the end 112 of the single-mode fiber 20, takes place via a lens 160 which is provided in addition and which is arranged between the coupling element 110 and the end 112 and likewise preferably borne by the substrate 114 of the laser diode 90.

As for the rest, the laser diode 90 is designed in the same manner as in the embodiment according to FIG. 5 and so the same reference numerals have been used and in this respect reference can be made in full to the laser diode illustrated in FIG. 5.

In a third embodiment of an inventive semiconductor laser unit 18", the laser-active layer 92" is irradiated by the laser radiation 100" in a direction 162 perpendicular to the layer plane 164 of the laser-active layer, whereby Bragg reflectors 96", 98" are arranged as phase gratings on both sides of the laser-active layer.

Figure 9:
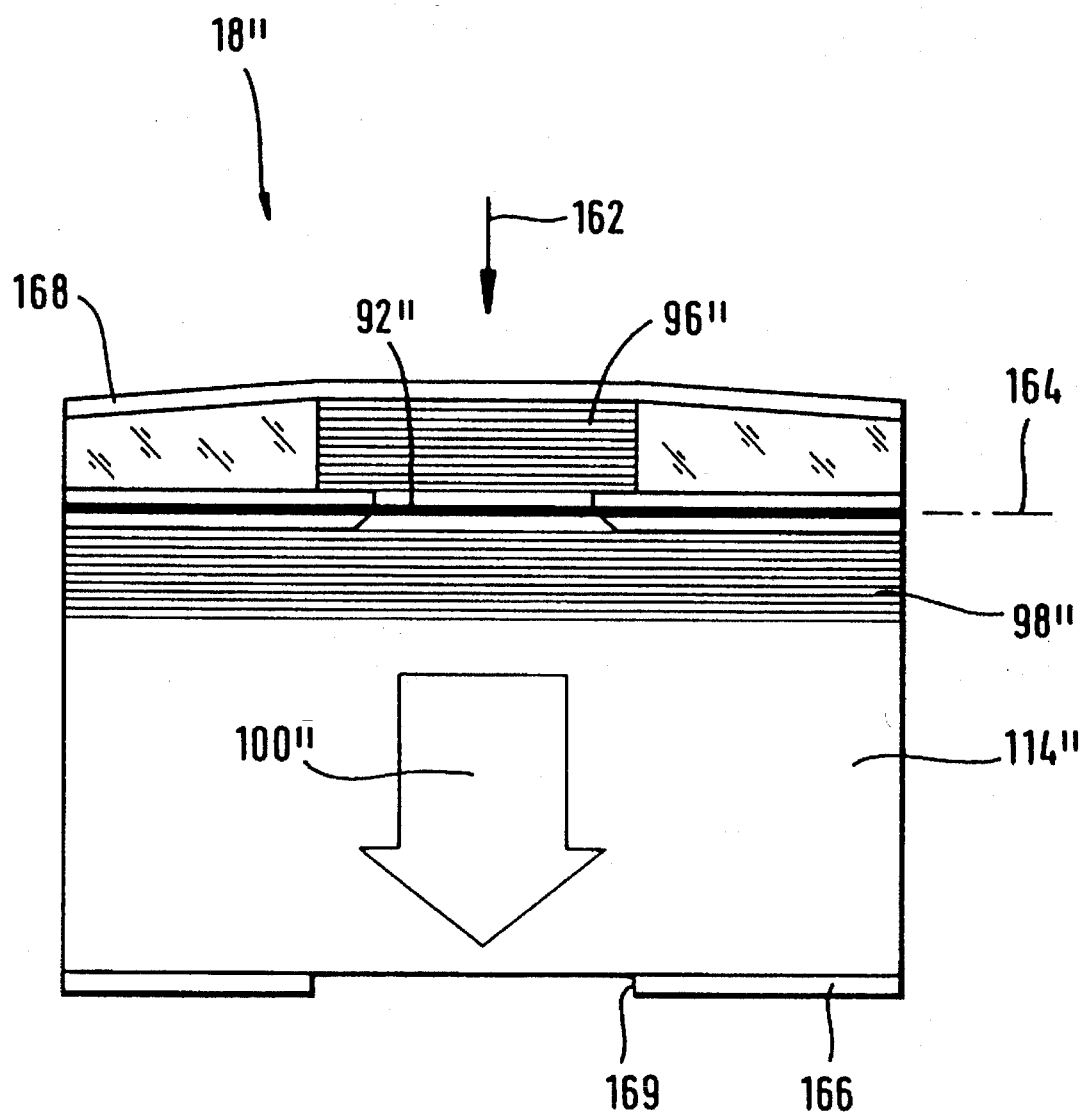
FIG. 9 is an illustration in the view similar to FIG. 5 of a third embodiment of a semiconductor laser unit.

The entire semiconductor laser unit 18", illustrated in FIG. 9, is constructed on a substrate 114", for example of gas, and provided on an underside and an upper side with contacts 166 and 168, respectively, via which the current is supplied, whereby the contact 166 allows the laser radiation 100" to pass through an opening 169.

As for the rest, this semiconductor laser unit 18" is constructed in a manner comparable to the semiconductor laser units 18 and 18' and so with respect to further details reference can be made to these embodiments.

Figure 10:
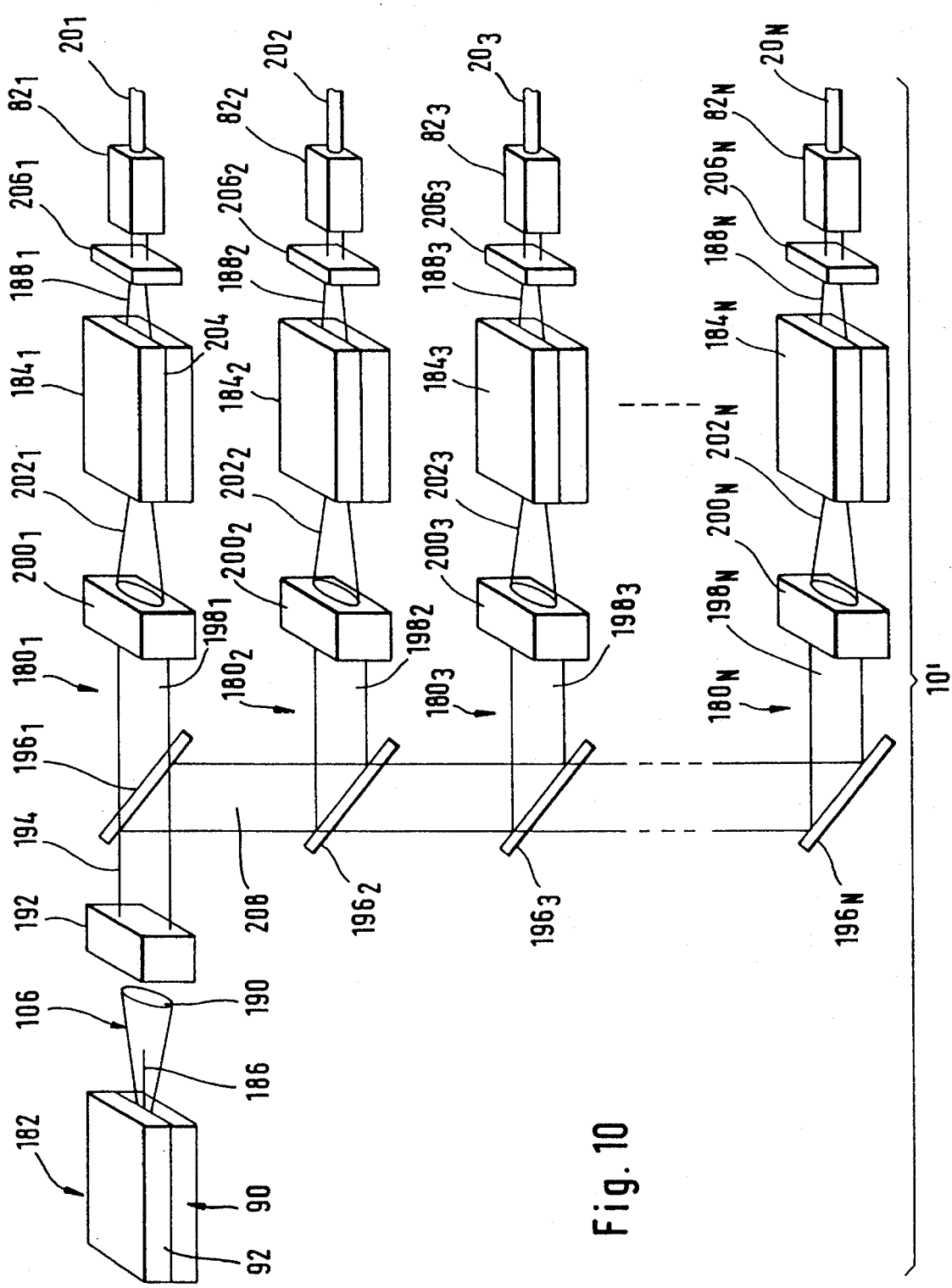
FIG. 10 is a schematic illustration of a variation of the first embodiment of an inventive semiconductor laser system.

A second variation of an inventive radiation generator system, designated as a whole as 10' in FIG. 10, likewise comprises a plurality of semiconductor laser units $\mathbf{180}_{1\ to\ N}$ with a laser oscillator 182 and a succeeding laser amplifier 184, whereby a single laser oscillator 182 generates a base laser radiation 186 which is supplied to a plurality of laser amplifiers $\mathbf{184}_{1\ to\ N}$. These amplifiers, for their part, then generate the laser radiation $\mathbf{188}_{1\ to\ N}$ which is coupled into the respective individual single-mode fibers $\mathbf{20}_{1\ to\ N}$, whereby a phase adjusting means $\mathbf{82}_{1\ to\ N}$ is provided in addition for the laser radiation $\mathbf{188}_{1\ to\ N}$ coming from each individual laser amplifier.

The laser oscillator 182 is, for its part, of an identical design to, for example, the laser diode 90 in FIG. 6 so that with respect to individual features the same reference numerals are used and, moreover, reference can be made to the comments concerning FIG. 6.

The propagating laser radiation 106 is, in this respect, the base laser radiation 186 which forms a radiation cone with an approximately oval cross section 190, the large axis of which is aligned parallel to the laser-active layer 92 and the small axis of which extends vertically thereto.

A radiation cone of this type is reshaped by a beam shaping optical means 192 on the oscillator side into a base laser radiation 186 propagating as plane wave 194. The plane wave 194 hereby impinges on a first beam splitter $\mathbf{196}_1$, which is designed to be partially transparent and allows a first branch $\mathbf{198}_1$ to pass through to a beam shaping optical means $\mathbf{200}_1$ on the amplifier side, this optical means, for its part, focusing the branch $\mathbf{198}_1$ propagating as a plane wave onto a laser-active layer 204 of the laser amplifier $\mathbf{184}_1$ in the form of a cone $\mathbf{202}_1$. In the laser-active layer 204, the base laser radiation is amplified in a known manner and exits from the amplifier as laser radiation $\mathbf{188}_{9991}$. Subsequently, the laser radiation $\mathbf{188}_1$ is, in turn, coupled into the single-mode fibers $\mathbf{20}_1$ by an optical imaging means $\mathbf{206}_1$, whereby the phase adjusting means $\mathbf{82}_1$ precedes, for example, the single-mode fibers $\mathbf{20}_1$.

In addition, the first beam splitter $\mathbf{196}_1$ couples out a further branch beam 208 of the plane wave 194 by reflection and focuses this onto a second beam splitter $\mathbf{196}_2$ which, in turn, couples a branch beam $\mathbf{198}_2$ out of the branch beam 208. This branch beam $\mathbf{198}_2$ is, for its part, focused onto the laser amplifier $\mathbf{184}_2$ via a beam shaping optical means $\mathbf{200}_2$ on the amplifier side so that this amplifier generates the laser radiation $\mathbf{188}_2$ which, in turn, is coupled into the single-mode fiber $\mathbf{20}_2$ via the beam shaping optical means $\mathbf{206}_2$.

The branch beam 208 passes through additional beam splitters $\mathbf{196}_3$ to $\mathbf{196}_N$ which likewise couple out branch beams $\mathbf{198}_3$ to $\mathbf{198}_N$. The respective laser amplifiers $\mathbf{184}_3$ to $\mathbf{184}_N$ generate on their basis the laser radiation $\mathbf{188}_3$ to $\mathbf{188}_N$ which is coupled into the corresponding single-mode fibers $\mathbf{20}_3$ to $\mathbf{20}_N$.

The advantage of the second variation of the inventive radiation generator system 10' is to be seen in the fact that no frequency stabilization is required in the individual semiconductor laser units 180 since all the semiconductor laser units $\mathbf{180}_{1\ to\ N}$ "use" the same laser oscillator 182 to generate the base laser radiation 186 with a frequency characteristic of the laser oscillator 182 so that the laser radiation $\mathbf{188}_{1\ to\ N}$ of all the laser amplifiers $\mathbf{184}_{1\ to\ N}$ automatically has the same frequency.

For this reason, only a coordination of the phase orientation of the laser radiation is required, as already described in the greatest detail in conjunction with the first embodiment.

A second embodiment of an inventive semiconductor laser system is based, for example, on the first embodiment of the inventive semiconductor laser system with a radiation generator system 10 according to the first variation.

In contrast to the first embodiment, however, at least two semiconductor laser units $\mathbf{18}_1$ and $\mathbf{18}_2$, $\mathbf{18}_3$ and $\mathbf{18}_4$ etc. are combined each time to form a group and operate at a frequency differing by a constant amount in relation to the respectively preceding group of semiconductor laser units having the lower ordinal number. For example, the frequency of the group consisting of the semiconductor laser units $\mathbf{18}_3$ and $\mathbf{18}_4$ is higher by 10 MHz than the frequency of the group consisting of the semiconductor laser units $\mathbf{18}_1$ and $\mathbf{18}_2$, the frequency of the group consisting of the semiconductor laser units $\mathbf{18}_5$ and $\mathbf{18}_6$ is higher by 10 MHz than the frequency of the group consisting of the semiconductor laser units $\mathbf{18}_3$ and $\mathbf{18}_6$.

Figure 11:
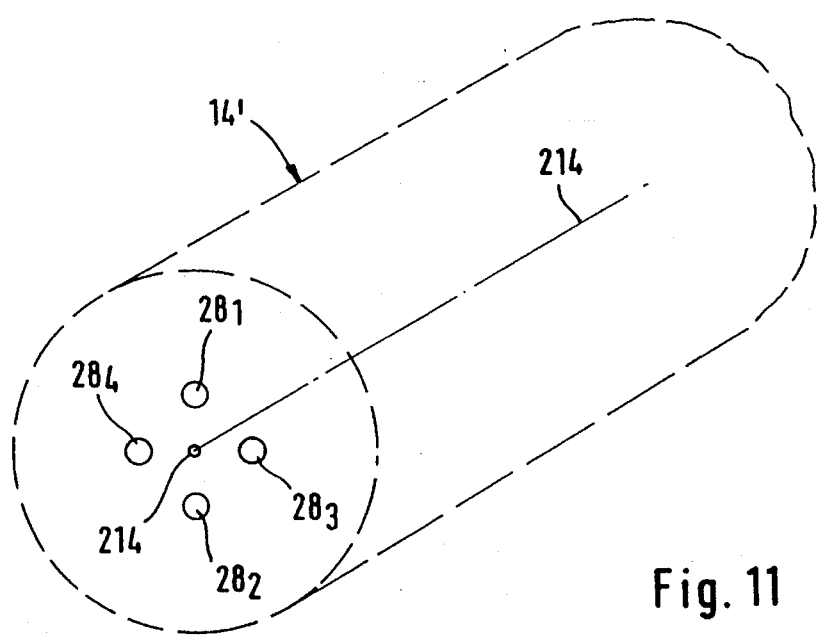
FIG. 11 is an illustration similar to FIG. 2 in a second embodiment of the inventive semiconductor laser system.

The two fiber end faces $28_1$ and $28_2$, $28_3$ and $28_4$ etc., which are associated with respective semiconductor laser units $18_1$ and $18_2$, $18_3$ and $18_4$ etc. forming a group, are, in addition, arranged to be symmetrical to an axis of symmetry common to all the groups, preferably a central axis 214 of the total laser radiation 14' (FIG. 11).

The setting of the individual frequencies of the individual semiconductor laser units $18_{1\ to\ N}$ takes place in the same way as described in conjunction with the first embodiment but with the difference that the control of the respective semiconductor laser unit $18_{1\ to\ N}$ takes place such that it is not the beat frequency zero which is set but a beat frequency relative to the semiconductor laser 18R which corresponds to the desired frequency difference. This means, for example, that the semiconductor laser units $18_1$ and $18_2$ are controlled such that the beat frequency zero is set in relation to the semiconductor laser unit 18R, the semiconductor laser units $18_3$ and $18_4$ such that the beat frequency 10 MHz is set in relation to the semiconductor laser unit 18R, the semiconductor laser units $18_5$ and $18_6$ such that the beat frequency 20 MHz is set in relation to the semiconductor laser unit 18R, etc.

This means that each group of semiconductor laser units $18_{1\ to\ N}$ generates a laser radiation with a constant frequency which does, however, vary in relation to the other groups of semiconductor laser units by a respectively predetermined difference.

Figure 12:
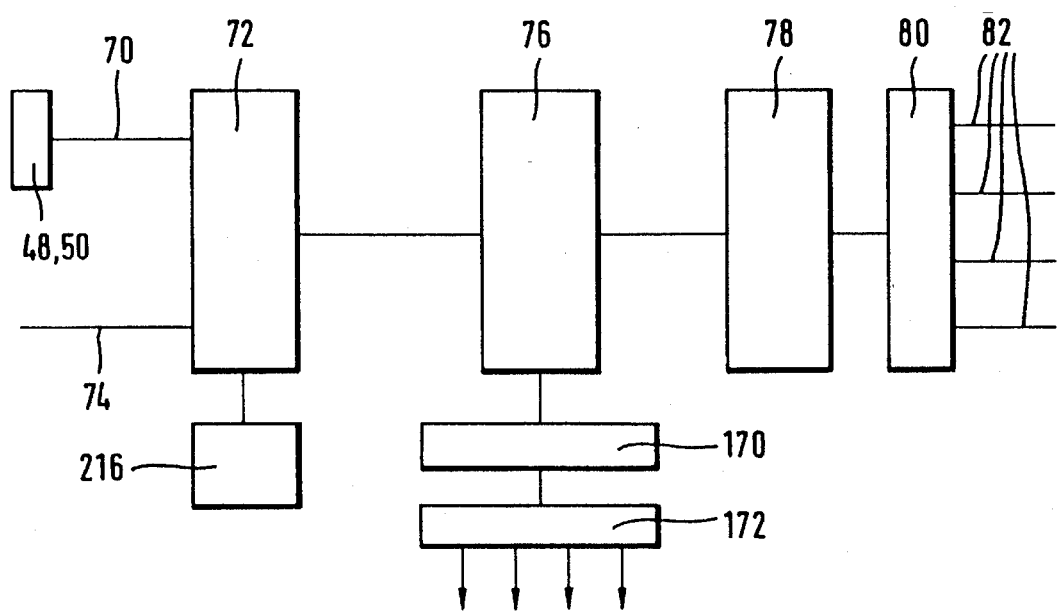
FIG. 12 is an illustration similar to FIG. 4 of the control for the second embodiment of the inventive semiconductor laser system.

The beat frequencies are—as illustrated in FIG. 12—generated electrically by a frequency generator 216, for example in the form of a basic frequency of 10 MHz and in the form of higher harmonics in relation to the basic frequency of 10 MHz, and are passed to the computer 72 as reference frequencies for the setting of the frequency of each group. The computer then sets the frequencies via the bus system 76 and the frequency control 170 as well as the bus system 172. In addition, the beat frequencies are set in a defined, predetermined phase orientation in relation to the stated reference frequencies via the phase control 78 and the bus system 80 in a manner already explained in conjunction with the first embodiment.

By comparison of the phase orientations of the beat frequencies measured each time with the phase detector 40 with the phase orientation of the reference frequencies and by setting a defined phase orientation in relation to the reference frequencies which is the same for all the laser radiations, for example the phase difference zero, a correction of the phase orientation takes place via the phase adjusting means 82 provided for this purpose for the laser radiation of each of the semiconductor laser units 18 so that, altogether, the phase orientations of the laser radiations of each of the semiconductor laser units $18_{1\ to\ N}$ are phase-correlated with one another at a predetermined point of time.

Figure 13:
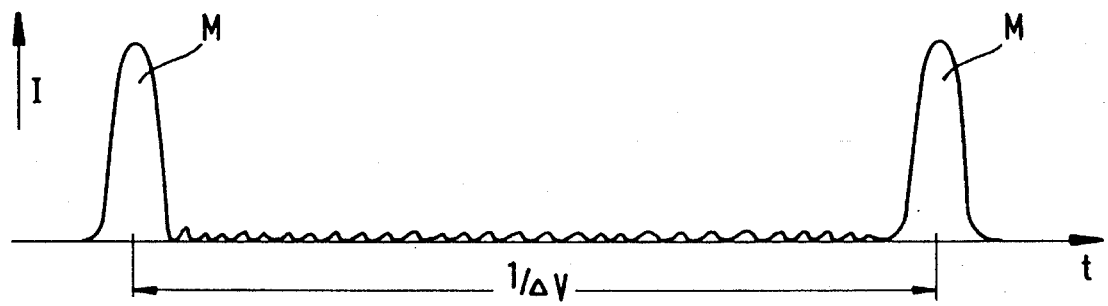
FIG. 13 is a schematic illustration of the time progression of the second embodiment of the inventive semiconductor laser system and FIG. 14 is an illustration similar to FIG. 11 in a variation of the second embodiment of the inventive solution.

The combination of the laser radiations of all the semiconductor laser units $18_{1\ to\ N}$ results, in the total laser radiation 14, in an intensity distribution illustrated in FIG. 13 over the time in such a manner that with a time interval of $t=1/\Delta V$ equal to the inverse constant frequency interval $\Delta V$ of the consecutive groups u of semiconductor laser units $18_{1\ to\ N}$ individual intensity maxima M occur while negligible maxima smaller in their intensity occur therebetween.

With u continuously operating groups of semiconductor laser units having the group power P and, each time, the frequency $V_u = V_o + u \times \Delta V$, this results in

| | |
|---|---|
| a top power at the intensity maxima M of | $\sim u^2 P$ |
| a sequence frequency of the intensity maxima M of | $\Delta V$ |
| and a line width at the intensity maxima M of | $\sim \dfrac{1}{\Delta V \times u}$ |

At a frequency difference of 10 MHz, the distance between the maxima M on the time axis amounts to $10^{-7}$ secs. Therefore, the total laser radiation 14' displays individual, consecutive laser pulses at defined time intervals.

Figure 14:
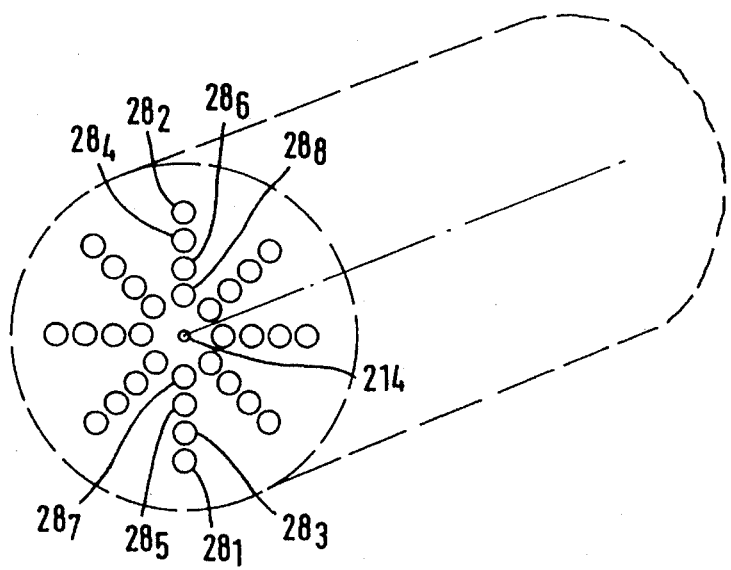

In a variation of the second embodiment, the construction is identical to that of the second embodiment described thus far with the difference that groups are formed not only of two but of eight semiconductor laser units $18_1$ to $18_8$, $18_9$ to $18_{16}$ etc. . . . . Their associated fiber end faces $28_1$ to $28_8$, $28_9$ to $28_{16}$ etc. are arranged in pairs symmetrically to the central axis 214 of the total laser radiation 14', as illustrated in FIG. 14.

As for the rest, the same effects as in the first embodiment can be obtained with this variation of the second embodiment.

We claim:

1. A semiconductor laser system comprising:

a plurality of semiconductor laser units for outputting laser radiation, each of said laser units including a laser oscillator;

said laser radiation output from each laser unit being coupled with low loss to a first end of one single mode light conduction fiber associated with said respective laser unit for guiding the laser radiation output from the laser unit to a second end remote from said first end;

a fiber bundle formed from the light conducting fibers of said plurality of laser units, an end of said fiber bundle being formed by said second ends of said light conducting fibers, said end of said fiber bundle outputting a combined laser radiation that is substantially the sum of the laser radiation output from each of said second ends; and means for independently controlling the phase of the laser radiation output from at least several of said laser units contributing to said combined laser radiation to establish desired phase relationships between different ones of said laser units;

wherein the combined laser radiation output from said end of said fiber bundle comprises a superposition of the radiation from said laser units that takes place at a predeterminable phase orientation established by said phase controlling means.

2. A semiconductor laser system as defined in claim 1 wherein the laser radiation output from each laser unit comprises a laser radiation field that is independent of the laser radiation fields output by the other laser units with respect to the phase of the laser radiation.

3. A semiconductor laser system as defined in claim 1 wherein the laser radiation output from each laser unit comprises a laser radiation field that is decoupled from the laser radiation fields output by the other laser units.

4. A semiconductor laser system as defined in claim 1 wherein the laser radiation output from each laser unit comprises a laser radiation field and said combined laser radiation comprises a combined laser radiation field, said laser radiation fields of the laser units being decoupled from said combined laser radiation field.

5. A semiconductor laser system as defined in claim 1 wherein said laser units operate at the same frequency.

6. A semiconductor laser system as defined in claim 1 wherein said laser units are frequency coupled to each other.

7. A semiconductor laser system as defined in claim 1 wherein said laser units are frequency stabilized.

8. A semiconductor laser system as defined in claim 7 wherein said frequency stabilization is provided by a frequency control responsive to at least one of temperature and current of the respective semiconductor laser unit.

9. A semiconductor laser system as defined in claim 1 wherein each laser unit comprises at least one individually current controllable diode zone controlling the frequency of the laser unit.

10. A semiconductor laser system as defined in claim 1 wherein said semiconductor laser units operate in a stabilized mode of operation.

11. A semiconductor laser system as defined in claim 10 wherein each of said laser units operates in a transversal basic mode of operation.

12. A semiconductor laser system as defined in claim 10 wherein each of said semiconductor laser units outputs a single longitudinal mode.

13. A semiconductor laser system as defined in claim 1 further comprising means for adjusting the phase of the laser radiation output from each laser unit.

14. A semiconductor laser system as defined in claim 13 wherein said phase adjusting means comprise at least two phase adjusting elements, a first one of said elements having a first time constant for phase adjustment and a second one of said elements having a second time constant for phase adjustment.

15. A semiconductor laser system as defined in claim 13 wherein said phase adjusting means comprise a control for each of said laser units.

16. A semiconductor laser system as defined in claim 15 wherein said control comprises a current control for the laser unit.

17. A semiconductor laser system as defined in claim 15 wherein said control comprises a temperature control for the laser unit.

18. A semiconductor laser system as defined in claim 15 wherein each of said laser units has at least two individually current controllable diode zones, each zone having a refractive index with a different dependency on the current therethrough, with one of said zones being used for phase adjustment.

19. A semiconductor laser system as defined in claim 13 wherein said phase adjusting means comprise a phase variation member arranged in the fiber coupled to each laser unit.

20. A semiconductor laser system as defined in claim 19 wherein said phase variation member for each laser unit is arranged in an end region of the fiber adjoining the laser unit.

21. A semiconductor laser system as defined in claim 19 wherein said phase variation member for each laser unit is formed by an active fiber section.

22. A semiconductor laser system as defined in claim 21 further comprising means for generating a phase adaptation in said active fiber section using one of an electrooptical and magnetooptical effect.

23. A semiconductor laser system as defined in claim 21 further comprising means for generating a phase adaptation in said active fiber section in response to a temperature change therein.

24. A semiconductor laser system as defined in claim 13 wherein said phase adjusting means comprises a phase variation member arranged between each laser unit and the single mode fiber coupled thereto.

25. A semiconductor laser system as defined in claim 24 wherein said phase variation member is arranged between the laser unit and an end of the single mode fiber facing the laser unit.

26. A semiconductor laser system as defined in claim 25 wherein said phase variation member comprises a polarization turning element.

27. A semiconductor laser system as defined in claim 24 wherein said phase variation member is one of an electrooptical and magnetooptical unit.

28. A semiconductor laser system as defined in claim 1 further comprising a phase detector arranged close to said end of the fiber bundle remote from said laser units, said phase detector detecting the laser radiation output from each laser unit as guided by the respective light conducting fiber.

29. A semiconductor laser system as defined in claim 28 wherein said phase detector comprises an interferometer.

30. A semiconductor laser system as defined in claim 28 wherein said phase detector compares the phase orientation of the laser radiation output from each laser unit to the phase orientation of the laser radiation output from a reference semiconductor laser unit operating at the same frequency as each of said plurality of laser units.

31. A semiconductor laser system as defined in claim 30 wherein said phase detector comprises a detector matrix, at least one selectively interrogatable element of said matrix receiving only the laser radiation of one respective semiconductor laser unit and the reference laser radiation.

32. A semiconductor laser system as defined in claim 31 further comprising:
 an evaluation circuit coupled to said phase detector for determining the phase orientation of the laser radiation in said combined laser radiation by detecting variations in power at each of a plurality of matrix elements of said detector matrix; and
 a control circuit responsive to said evaluation circuit for controlling the phase orientation of the laser radiation output from each laser unit with respect to said combined laser radiation;
 wherein the phase orientation of the laser radiation that forms said combined laser radiation can be provided in a defined manner.

33. A semiconductor laser system as defined in claim 32 wherein said evaluation circuit is connected to a phase control via a bus system.

34. A semiconductor laser system as defined in claim 32 wherein said evaluation circuit is connected to a frequency control via a bus system.

35. A semiconductor laser system as defined in claim 28 wherein said phase detector comprises a coupling out element for coupling part of the laser radiation of each semiconductor laser unit out of said combined laser radiation.

36. A semiconductor laser system as defined in claim 28 wherein said reference laser radiation is modulated by one of power and phase.

37. A semiconductor laser system as defined in claim 36 further comprising a modulator for modulating said reference laser radiation.

38. A semiconductor laser system as defined in claim 28 further comprising:
 an evaluation circuit coupled to said phase detector for determining the phase orientation of the laser radiation in said combined laser radiation; and a control circuit responsive to said evaluation circuit for controlling the phase orientation of the laser radiation output from each laser unit with respect to said combined laser radiation;

wherein the phase orientation of the laser radiation that forms said combined laser radiation can be provided in a defined manner.

39. A semiconductor laser system as defined in claim 38 wherein said evaluation circuit includes a measuring circuit for measuring the power of the laser radiation output by each laser unit, said laser system further comprising means for controlling said power.

40. A semiconductor laser system as defined in claim 1 wherein the end of said fiber bundle remote from said laser units comprises said second end faces of the single mode fibers, from which the combined laser radiation is optically imageable onto a target surface.

41. A semiconductor laser system as defined in claim 40 wherein adjacent ones of said second end faces are separated by a space that is less than three times the fiber thickness.

42. A semiconductor laser system as defined in claim 40 wherein said second end faces are located next to one another in the end of the fiber bundle remote from said laser units.

43. A semiconductor laser system as defined in claim 40 wherein the shape of said end of the fiber bundle corresponds to the shape of a surface of an object to be irradiated in the region of said target surface.

44. A semiconductor laser system as defined in claim 40 wherein said second end faces are essentially arranged in a plane forming the end of said fiber bundle.

45. A semiconductor laser system as defined in claim 40 further comprising means for optically imaging a target with the combined laser radiation, wherein the shape of said end of the fiber bundle corresponds to optical imaging properties of said imaging means.

46. A semiconductor laser system as defined in claim 1 wherein each of said laser units includes a respective laser active diode strip.

47. A semiconductor laser system as defined in claim 46 wherein each of said laser units further includes a laser oscillator followed by a laser amplifier.

48. A semiconductor laser system as defined in claim 46 wherein each of said laser units further comprises a phase grating for mode stabilizing the laser unit.

49. A semiconductor laser system as defined in claim 46 wherein all of said laser units operate at the same frequency using a common laser oscillator that generates a base laser radiation, each laser unit including a laser amplifier for amplifying said base laser radiation to provide the laser radiation output from the laser unit coupled into the single mode light conducting fiber.

50. A semiconductor laser system as defined in claim 49 further comprising beam splitting means for coupling the base laser radiation into the respective laser amplifiers of each laser unit.

51. A semiconductor laser system as defined in claim 50 further comprising beam shaping optical means for imaging the base laser radiation from said beam splitting means into said laser amplifiers.

52. A semiconductor laser system as defined in claim 49 wherein said base laser radiation propagates divergently, said system further comprising beam shaping optical means for reshaping the divergent base laser radiation into radiation that propagates as a plane wave.

53. A semiconductor laser system as defined in claim 1 wherein each of said laser units comprises a coupled array of laser active diode strips.

54. A semiconductor laser system as defined in claim 1 wherein said low loss coupling means of each laser unit comprises an imaging element borne by a substrate of the laser unit.

55. A semiconductor laser system as defined in claim 54 wherein said imaging element focuses the laser radiation produced by the respective laser unit and propagating parallel to said substrate into the respective single mode light conducting fiber.

56. A semiconductor laser system as defined in claim 1 wherein said laser units collectively generate laser radiation having a sequence of frequencies with a constant frequency interval, the laser radiation from said plurality of laser units having the same phase orientation at a defined point in time.

57. A semiconductor laser system as defined in claim 1 wherein said laser units form groups, each group radiating with the same frequency.

58. A semiconductor laser system as defined in claim 1 further comprising a phase detector for the laser radiation output from each laser unit, said phase detector being arranged at said end of the fiber bundle remote from said laser units.

59. A semiconductor laser system as defined in claim 58, said phase detector detecting the laser radiation output from the second end of each light conducting fiber.

* * * * *